United States Patent
Chang et al.

(10) Patent No.: US 12,283,335 B2
(45) Date of Patent: Apr. 22, 2025

(54) STORAGE DEVICE SUITABLE FOR HIGH TEMPERATURE

(71) Applicant: TEAM GROUP INC., New Taipei (TW)

(72) Inventors: Chin Feng Chang, New Taipei (TW); Hsun Chia Ma, New Taipei (TW); Wei Hsiang Wang, New Taipei (TW)

(73) Assignee: TEAM GROUP INC., New Taipei (TW)

( * ) Notice: Subject to any disclaimer, the term of this patent is extended or adjusted under 35 U.S.C. 154(b) by 197 days.

(21) Appl. No.: 18/210,099

(22) Filed: Jun. 15, 2023

(65) Prior Publication Data
US 2024/0363151 A1    Oct. 31, 2024

(30) Foreign Application Priority Data
Apr. 26, 2023   (TW) .................................. 112115624

(51) Int. Cl.
*G11C 7/04*    (2006.01)
(52) U.S. Cl.
CPC .................................... *G11C 7/04* (2013.01)
(58) Field of Classification Search
CPC ........................................................ G11C 7/04
USPC ........................................... 365/211, 189.05
See application file for complete search history.

(56) References Cited

U.S. PATENT DOCUMENTS

| | | | | |
|---|---|---|---|---|
| 9,670,330 | B2* | 6/2017 | Pretsch | ............... C09B 67/0083 |
| 2004/0026402 | A1* | 2/2004 | Ito | ..................... H01L 21/67109 |
| | | | | 219/448.11 |
| 2013/0227268 | A1* | 8/2013 | Ichida | ................... H10N 10/00 |
| | | | | 713/100 |
| 2015/0204556 | A1* | 7/2015 | Kusukame | ......... B60H 1/00742 |
| | | | | 250/338.3 |
| 2016/0086663 | A1* | 3/2016 | Lee | ....................... G11C 13/004 |
| | | | | 365/163 |
| 2017/0234737 | A1* | 8/2017 | Nogami | .................... G01K 7/42 |
| | | | | 702/130 |
| 2022/0011963 | A1* | 1/2022 | Sanuki | .................. G06F 3/0679 |

\* cited by examiner

*Primary Examiner* — Michael T Tran
(74) *Attorney, Agent, or Firm* — WPAT, PC

(57) ABSTRACT

The present invention provides a storage device suitable for high temperature. A plurality of memory devices are disposed on the top of a substrate, respectively, and connected electrically to a control device and a temperature sensor. The temperature sensor includes a first predetermined temperature, a second predetermined temperature, and a third predetermined temperature. The temperature sensor is used for sensing the temperature of the plurality of memory devices and generating a temperature value. The control device adjusts the transmission rate of the storage signal to make the storage device adapt to high temperature environments.

10 Claims, 4 Drawing Sheets

STORAGE DEVICE SUITABLE FOR HIGH TEMPERATURE

BACKGROUND OF THE INVENTION

Owing to the prevalence of environmental protection and new energy policies, the market demand of electric cars is growing, stimulating continuous progress in electric car technologies.

Thanks to the improvement in the battery technology, the development of the smart internet technology, and the promotion of new energy policies, the development trend of electric cars has become apparent. In particular, the battery technology has been being the bottleneck of the development of electric cars. In recent years, new battery technologies such as lithium-ion batteries have emerged. Consequently, the recharge range of electric cars is significantly extended, making them the best choice for more consumers.

In electric cars, the smart internet applications for providing more convenient user experience, for example, smart voice assist, self-driving, and remote control, attract increasing attention. In addition, new energy policies, such as subsidy, tax deduction, limiting traditional oil cars, are promoted worldwide. These policies facilitate the development of the market of electric cars.

Due to the development of electric cars, the demand for the mechanical and electronic components used in electric cars is increasing year by year. Among them, automotive chips are particularly important components in electric cars.

Automotive chips, for example, processors and memories, are miniature electronic devices applied in automotive electronic systems for controlling the operations of the systems in a car such engine control, wheel spin rate monitoring, airbag control, and audio and entertainment system control. As automotive electronics process continuously, the applications of automotive chips become more extensive.

Automotive chips can be used in controlling the ignition timing, fuel injection, and oxygen sensor of an engine for achieving high-efficiency operation. In addition, they can be applied to control the wheel spin rate monitoring systems, such as the ABS system and the electronic stabilization control system, for improving driving safety. When applied to the airbag system, automotive chips can protect the passengers when a crash occurs. Finally, automotive chips can be used in controlling the audio and entertainment system, for example, the radio, player, and Bluetooth connection, for providing superior audio effects and user experience.

In general, automotive chips adopt high-reliability fabrication and packaging technologies for ensuring the reliability and stability in driving environments.

Nonetheless, the internal environment of cars or vehicle equipped with automotive chips according to the prior art is relatively harsh, particularly in the engine room and the wheel spin rate monitoring system. Due to the high pressure, high vibration, high humidity, and, in particular, high temperature environment, the reliability requirements for automotive electronic equipment are strict. Accordingly, it is highly required to have a storage device suitable for high temperature environments that can operate efficiently in high temperatures.

To solve the problem according to the prior art as described above, the present invention provides a storage device suitable for high temperature, which uses a control device and a temperature sensor for lowering the transmission rate of the memory devices with increased temperature by stages according to predetermined temperatures. By slowing down the heat generated by the memory devices, the temperature can be decreased and making the memory devices suitable for high temperature environments.

SUMMARY OF THE INVENTION

An objective of the present invention is to provide a storage device suitable for high temperature, which uses a control device and a temperature sensor for adjusting the transmission rate of the memory devices with increased temperature by stages according to a first, second, and third predetermined temperature. Thereby, the temperature of the memory devices can be controlled within a certain range and thus making the storage device adapt to high temperature environments.

To achieve the above objective and efficacy, the present invention provides a storage device suitable for high temperature, which comprises: a substrate, a plurality of memory devices, a control device, and a temperature sensor. The plurality of memory devices are disposed on the top of the substrate, respectively. The control device is disposed on the top of the substrate and connected electrically to the plurality of memory devices for transmitting a storage signal. The temperature sensor is disposed on the top of the substrate and connected electrically to the control device. The temperature sensor includes a first predetermined temperature, a second predetermined temperature, and a third predetermined temperature. The temperature sensor is used for sensing the temperature of the plurality of memory devices and generating a temperature value. The control device lowers the storage signal to a first transmission rate if the temperature value is greater than the first predetermined temperature and smaller than the second predetermined temperature. The control device lowers the storage signal to a second transmission rate if the temperature value is greater than the second predetermined temperature. The control device lowers the storage signal to a third transmission rate if the temperature value is greater than the third predetermined temperature. By adjusting the transmission rate of the storage device, the heat dissipation efficiency of the storage device can be improved and thus adapting to high temperature environments.

According to an embodiment of the present invention, the plurality of memory devices is a random access memory; and the substrate is a circuit board for the random access memory.

According to an embodiment of the present invention, the substrate and the plurality of memory devices are solid-state drives with PCIe M.2 specifications.

According to an embodiment of the present invention, the first predetermined temperature is between 85° C. and 95° C.

According to an embodiment of the present invention, the second predetermined temperature is between 95° C. and 105° C.

According to an embodiment of the present invention, the third predetermined temperature is between 105° C. and 110° C.

According to an embodiment of the present invention, the first transmission rate, the second transmission rate, and the third transmission rate are a read transmission rate and a write transmission rate of the plurality of memory devices.

According to an embodiment of the present invention, the first transmission rate is greater than the second transmission rate; and the second transmission rate is greater than the third transmission rate.

According to an embodiment of the present invention, the second transmission rate is 30% to 40% of the first transmission rate; and the third transmission rate is 60% to 70% of the second transmission rate.

According to an embodiment of the present invention, the temperature of the plurality of memory devices corresponds to an ambient temperature.

DETAILED DESCRIPTION OF THE INVENTION

In order to make the structure and characteristics as well as the effectiveness of the present invention to be further understood and recognized, the detailed description of the present invention is provided as follows along with embodiments and accompanying figures.

The present invention is to provide a storage device suitable for high temperature, which uses a control device and a temperature sensor for adjusting the transmission rate of the memory devices with increased temperature by stages according to a first, second, and third predetermined temperature. Thereby, the temperature of the memory devices can be controlled within a certain range and thus making the storage device adapt to high temperature environments.

Figure 1:
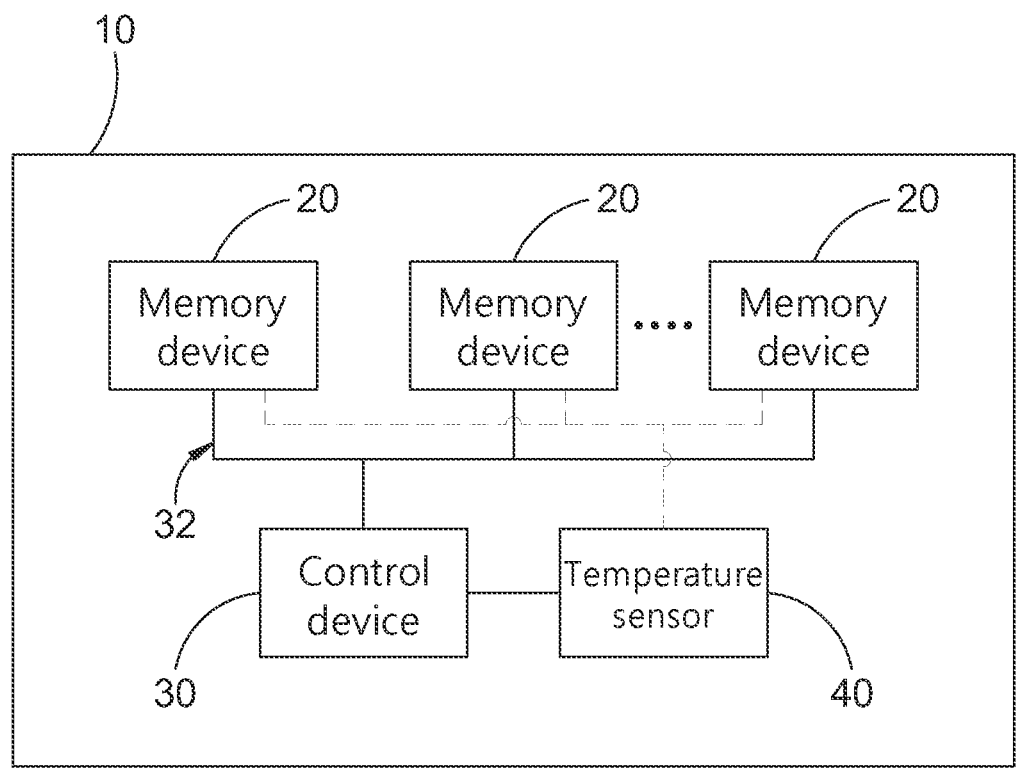
FIG. 1 shows a schematic diagram of the structure according to an embodiment of the present invention.

Please refer to FIG. 1, which shows a schematic diagram of the structure according to an embodiment of the present invention. As shown in the figure, the present embodiment the first embodiment. According to the present embodiment, a storage device suitable for high temperature is provided. It comprises a substrate 10, a plurality of memory devices 20, a control device 30, and a temperature sensor 40. According to the present embodiment, the substrate 10 is a circuit board and connected electrically to another circuit board, for example, the motherboard.

Please refer again to FIG. 1. As shown in the figure, according to the present embodiment, the plurality of memory devices 20 are disposed on the top of the substrate 10, respectively. The control device 30 is disposed on the top of the substrate 10 and connected electrically to the plurality of memory devices 20 for transmitting a storage signal 32. The temperature sensor 40 is disposed on the top of the substrate 10 and connected electrically to the control device 30. The temperature sensor 40 is used for sensing the temperature of the plurality of memory devices 20 and giving a temperature value. Then the temperature sensor 40 transmits the temperature value to the control device 30.

According to an embodiment, the plurality of memory devices 20 is a random access memory; and the corresponding substrate 10 is a circuit board for the random access memory. According to an embodiment, the random access memory is further a double data rate fifth-generation synchronous dynamic random-access memory (DDR5 SDRAM). Nonetheless, the present invention is not limited to the embodiment.

According to an embodiment of the present invention, the substrate 10 and the plurality of memory devices 20 are solid-state drives with PCIe M.2 specifications. Nonetheless, the present invention is not limited to the embodiment.

Figure 2:
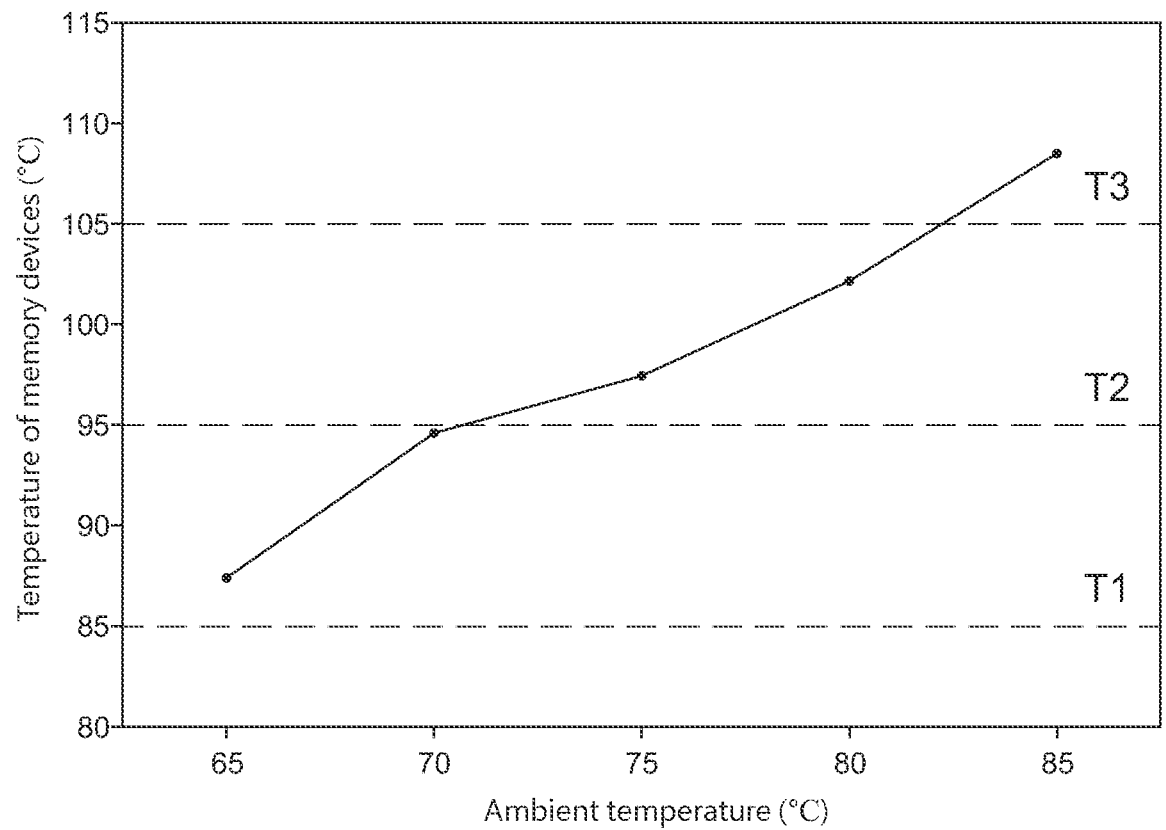
FIG. 2 shows a schematic diagram of temperature relation according to an embodiment of the present invention.
Figure 3A:
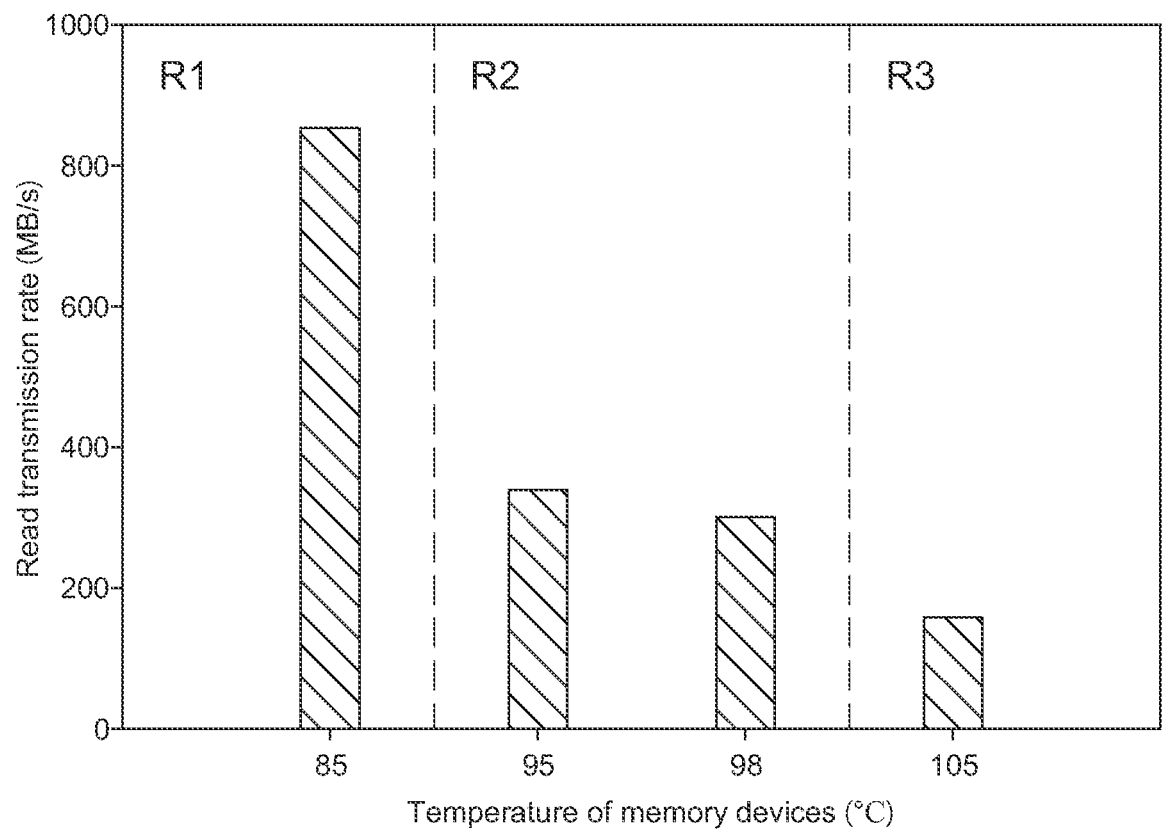
FIG. 3A and FIG. 3B show schematic diagrams of transmission rate according to an embodiment of the present invention.
Figure 3B:
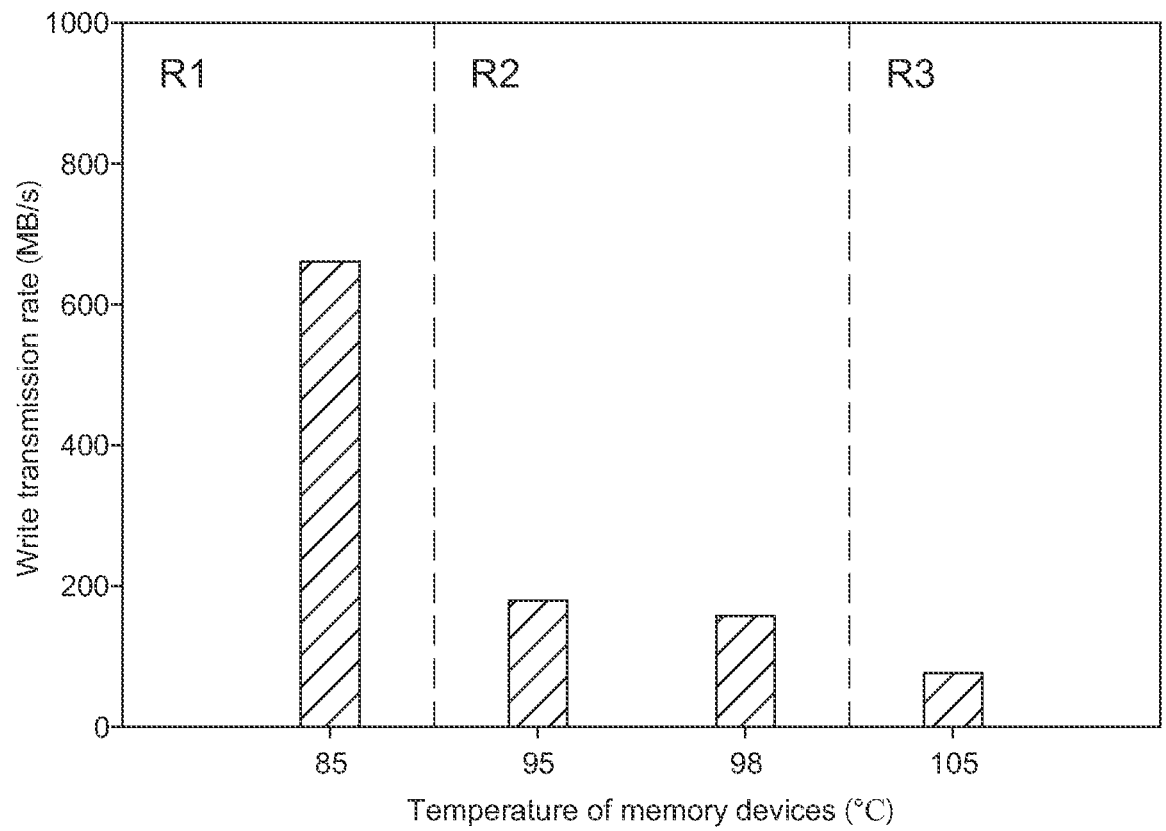

Please refer to FIG. 1 again, and to FIG. 2, FIG. 3A, and FIG. 3B. FIG. 2 shows a schematic diagram of temperature relation according to an embodiment of the present invention. FIG. 3A and FIG. 3B show schematic diagrams of transmission rate according to an embodiment of the present invention. As shown in the figures, according to the present embodiment, the temperature sensor 40 includes a first predetermined temperature T1, a second predetermined temperature T2, and a third predetermined temperature T3 prestored in the temperature sensor 40. The temperature sensor 40 senses the temperature of the plurality of memory devices 20, generates a temperature value, and transmits the temperature value to the control device 30 for controlling the transmission rate of the storage signal 32 to the plurality of memory devices 20.

According to the present embodiment, when the temperature value sensed by the temperature sensor 40 is greater than the first predetermined temperature T1 and smaller than the second predetermined temperature T2, it means that the ambient temperature is rising. At this moment, the control device 30 lowers the rate of the storage signal 32 to a first transmission rate R1 correspondingly for reducing the heat generated by the plurality of memory device 20 and maintaining the overall temperature of the storage device. When the plurality of memory devices 20 continue to operate or the ambient temperature further rises to make the sensed temperature value greater than the second predetermined temperature T2, it means that the temperature of the plurality of memory device 20 has increased to the temperature affecting data transmission. The control device 30 lowers the storage signal 32 to a second transmission rate R2 for reducing the temperature of the overall storage device below the second predetermined temperature T2. If the plurality of memory devices 20 continue to operate or the ambient temperature further rises to make the sensed temperature value greater than the third predetermined temperature T3, the control device 30 lowers the storage signal 32 to a third transmission rate R3 for forcibly reducing the heat generated by the plurality of memory device 20. By lowering the temperature of the storage device, damages due to overheat in the plurality of memory device 20 can be avoided.

According to the present embodiment, the temperature of the plurality of memory devices 20 corresponds to an ambient temperature. Thereby, the temperature value sensed by the temperature sensor 40 corresponds to the ambient temperature. The temperature value is proportional to the ambient temperature. According to the present embodiment, the ambient temperature is the temperature of the environment of the substrate 10, for example, the temperature inside the chassis of a desktop computer, the temperature inside a notebook computer, or the temperature inside the dashboard of a vehicle. Nonetheless, the present invention is not limited to the embodiment.

According to the present embodiment, the first transmission rate R1, the second transmission rate R2, and the third transmission rate R3 are a read transmission rate and a write transmission rate of the plurality of memory devices 20.

According to the present embodiment, the first transmission rate R1 is greater than the second transmission rate R2; and the second transmission rate R2 is greater than the third transmission rate R3.

Please refer again to FIGS. 1, 2, 3A, and 3B. As shown in the figures, according to the present embodiment, the first predetermined temperature T1 is between 85° C. and 95° C.; the second predetermined temperature T2 is between 95° C. and 105° C.; and the third predetermined temperature T3 is between 105° C. and 110° C.

According to the present embodiment, for example, the first predetermined temperature T1 is 85° C.; the second predetermined temperature T2 is 95° C.; and the third predetermined temperature T3 is 105° C. Please refer to FIG. 2. For example, when the storage device is in use and the ambient temperature is 65° C., the temperature value sensed by the temperature sensor 40 is 87° C. At this moment, the temperature value has been greater than the first predetermined temperature T1. Thereby, the control device 30 lowers the rate of the storage signal 32 to the first transmission rate R1 correspondingly. When the storage device is in use and the ambient temperature is 75° C., the temperature value sensed by the temperature sensor 40 is 96° C. At this time, the temperature value has been greater than the second predetermined temperature T2. Thereby, the control device 30 lowers the rate of the storage signal 32 to the second transmission rate R2 correspondingly. When the storage device is in use and the ambient temperature is 85° C., the temperature value sensed by the temperature sensor 40 is 108° C. At this moment, the temperature value has been greater than the third predetermined temperature T3. Thereby, the control device 30 lowers the rate of the storage signal 32 to the third transmission rate R3 correspondingly.

According to an embodiment, the second transmission rate R2 is 30% to 40% of the first transmission rate R1; and the third transmission rate R3 is 60% to 70% of the second transmission rate R2. For example, when the read transmission rate of the first transmission rate R1 is 820 MB/s, the corresponding read transmission rate of the second transmission rate R2 is 320 MB/s and the corresponding read transmission rate of the third transmission rate R3 is 210 MB/s. Alternatively, when the write transmission rate of the first transmission rate R1 is 680 MB/s, the corresponding write transmission rate of the second transmission rate R2 is 260 MB/s and the corresponding write transmission rate of the third transmission rate R3 is 170 MB/s. Nonetheless, the present invention is not limited to the embodiment.

According to the present embodiment, the control device 30 on substrate 10 uses the temperature sensor 40 to sense the temperature of the plurality of memory device 20. At different temperatures, the first, second, and third predetermined temperature T1, T2, T3 are used to adjust by stages the transmission rate of the plurality of memory devices 20 with increased temperature so that the temperature of the plurality of memory devices 20 can be controlled within a certain range. According to the prior art, when the temperature of the storage device exceeds the predetermined value, the control device will stop the transmission of memory devices. Consequently, the storage device will be shut down and become unusable, leading to possible danger. On the contrary, according to the present embodiment, the transmission rate is lowered instead. The storage device still can operate at a lower speed. Thereby, the present embodiment is suitable for high temperature environments.

To sum up, the present invention provides a storage device suitable for high temperature, which uses a control device and a temperature sensor for adjusting the transmission rate of the memory devices with increased temperature by stages according to predetermined temperatures. Thereby, the temperature of the memory devices can be maintained or lowered and thus making the storage device suitable for high temperature environments such as automotive dashboards or the microcomputer for automotive motors. Thereby, the problem of adapting to high temperature environments for storage device according to the prior art can be solved.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A storage device suitable for high temperature, comprising:
    a substrate;
    a plurality of memory devices, disposed on the top of said substrate, respectively;
    a control device, disposed on the top of said substrate, and connected electrically to said plurality of memory devices for transmitting a storage signal; and
    a temperature sensor, disposed on the top of said substrate and connected electrically to said control device, including a first predetermined temperature, a second predetermined temperature, and a third predetermined temperature, used for sensing the temperature of said plurality of memory devices and generating a temperature value, said control device lowering said storage signal to a first transmission rate if said temperature value is greater than said first predetermined temperature and smaller than said second predetermined temperature, said control device lowering said storage signal to a second transmission rate if said temperature value is greater than said second predetermined temperature, and said control device lowering said storage signal to a third transmission rate if said temperature value is greater than said third predetermined temperature.

2. The storage device suitable for high temperature of claim 1, wherein said plurality of memory devices is a random access memory; and said substrate is a circuit board for the random access memory.

3. The storage device suitable for high temperature of claim 1, wherein said substrate and said plurality of memory devices are solid-state drives with PCIe M.2 specifications.

4. The storage device suitable for high temperature of claim 1, wherein said first predetermined temperature is between 85° C. and 95° C.

5. The storage device suitable for high temperature of claim 1, wherein said second predetermined temperature is between 95° C. and 105° C.

6. The storage device suitable for high temperature of claim 1, wherein said third predetermined temperature is between 105° C. and 110° C.

7. The storage device suitable for high temperature of claim 1, wherein said first transmission rate, said second transmission rate, and said third transmission rate are a read transmission rate and a write transmission rate of said plurality of memory devices.

8. The storage device suitable for high temperature of claim 1, wherein said first transmission rate is greater than said second transmission rate; and said second transmission rate is greater than said third transmission rate.

9. The storage device suitable for high temperature of claim 1, wherein said second transmission rate is 30% to 40% of said first transmission rate; and said third transmission rate is 60% to 70% of said second transmission rate.

10. The storage device suitable for high temperature of claim 1, wherein the temperature of said plurality of memory devices correspond to an ambient temperature.

* * * * *